(12) United States Patent
Date et al.

(10) Patent No.: US 7,437,340 B2
(45) Date of Patent: Oct. 14, 2008

(54) DESIGNING OF A LOGIC CIRCUIT FOR TESTABILITY

(75) Inventors: Hiroshi Date, Fukuoka (JP); Toshinori Hosokawa, Tokyo (JP); Michiaki Muraoka, Nara (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 620 days.

(21) Appl. No.: 10/190,158

(22) Filed: Jul. 5, 2002

(65) Prior Publication Data

US 2003/0097347 A1    May 22, 2003

(30) Foreign Application Priority Data

Nov. 21, 2001  (JP) ............................. 2001-356330

(51) Int. Cl.
*G06F 17/00* (2006.01)
*G06N 5/02* (2006.01)
(52) U.S. Cl. ............................. 706/47; 706/46; 706/45
(58) Field of Classification Search ................ 706/47, 706/46, 45; 716/18
See application file for complete search history.

(56) References Cited

U.S. PATENT DOCUMENTS 5,513,123 A    4/1996  Dey et al.
6,106,568 A  *  8/2000  Beausang et al. ............. 716/18
6,311,317 B1 * 10/2001  Khoche et al. ................ 716/18
6,931,572 B1 *  8/2005  Schubert et al. .............. 714/34

OTHER PUBLICATIONS

Takabatake, et al., "Non-Scan Design for Testable Data Paths Using Thru Operation", IEEE, Mar. 1997, pp. 313-318.
Ohtake, et al., "A Non-Scan DFT Method for Controllers to Achieve Complete Fault Efficiency", IEEE, Sep. 1998, pp. 204-211.
Wada, et al., "A Non-Scan DFT Method for Data Paths to Provide Complete Fault Efficiency" IEICE Transaction D-I, vol. J82-D-I, No. 7, pp. 843-851, Jul. 1999. (See p. 1, lines 11-18 of the specification for brief explanation).

* cited by examiner

*Primary Examiner*—Joseph P Hirl
(74) *Attorney, Agent, or Firm*—Christie, Parker & Hale, LLP (57) ABSTRACT

The area of the circuit to be added for easy testability is reduced. Operations contained in a behavioral description are extracted in an operation analyzing unit; when expanding any operation at the time of behavioral synthesis, if the area of the circuit can be reduced to a greater extent when a DFT is applied to the operation before expansion, a parameter indicating that the operation is not to be expanded at the time of behavioral synthesis is generated and DFT information is added to a DFT library. A behavioral synthesis unit, in accordance with the parameter, generates an RTL description without expanding the operation. A DFT unit implements the DFT by referring to the DFT library, and thereafter expands the operation.

12 Claims, 10 Drawing Sheets

DESIGNING OF A LOGIC CIRCUIT FOR TESTABILITY

CROSS-REFERENCE TO RELATED APPLICATION

This application claims priority of Japanese Patent Application number 2001-356330, filed Nov. 21, 2001.

BACKGROUND OF THE INVENTION

1. Field of the Invention

The present invention relates to a method and apparatus for applying a design-for-testability (DFT) technique to a logic circuit, and a program for implementing the same.

2. Description of the Related Art

Prior known DFT techniques for logic circuits include one described in a paper by Wada H., Masuzawa, K. Saluja, and Fujiwara, entitled "A non-scan DFT method for data paths to provide complete fault efficiency," IEICE Transaction D-I, VOL. J82-D-I, No. 7, July 1999. According to this paper, a register transfer level (RTL) circuit description and a DFT library are input to generate an RTL circuit with DFT by incorporating circuits for realizing DFT therein.

The circuits for realizing DFT, each having a register hold function or a pass-through function using a mask element or a bypass circuit, are added, as needed, to each circuit element in order to enable an arbitrary value to be applied from an external input to an input of the circuit element under test and an output value from the circuit element to be propagated to an external output.

SUMMARY OF THE INVENTION

In generating the circuit with DFT, it is desired that the area of the circuit to be added to each arithmetic operation unit for easy testability be made as small as possible. An object of the present invention is to reduce the area of the circuit to be added for easy testability.

To solve this problem, according to the present invention, operations contained in a behavioral description are extracted and, for each extracted operation, a decision is made as to whether DFT is to be applied to the operation before expansion or to each of a plurality of circuit elements into which the operation has been expanded, and an RTL description with DFT is generated from the behavioral description in accordance with the thus made decision.

The decision is made, for example, by evaluating the increase in circuit area that would result from applying DFT.

DESCRIPTION OF THE PREFERRED EMBODIMENTS

Figure 1:
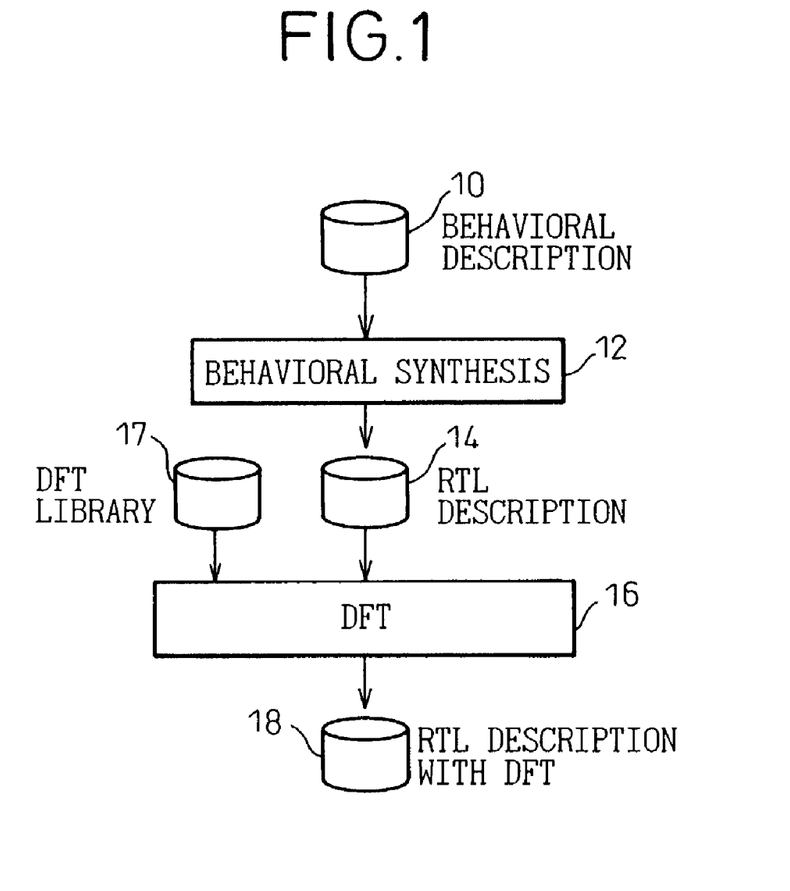
FIG. 1 is a diagram showing a DFT process according to the prior art.
Figure 2:
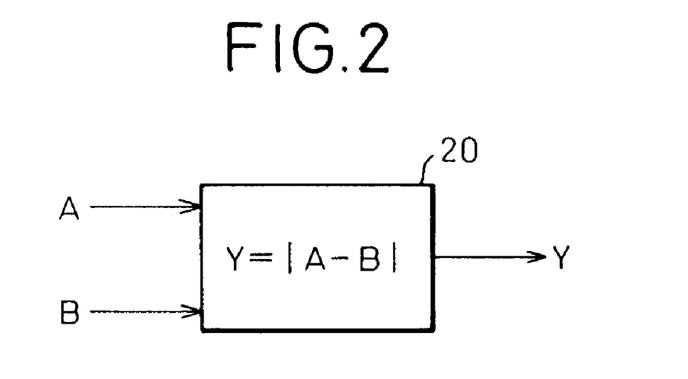
FIG. 2 is a diagram showing one example of an operation contained in a behavioral description.

In the prior art, the addition of the circuits for realizing DFT has been implemented, as shown in FIG. 1, by first generating an RTL description 14 by behavioral synthesis 12 from a behavioral description 10 which describes circuit behavior in the C language or the like, and then referring to a DFT library 17 (16 and 18). When generating the RTL description 14, each operation contained in the behavioral description, for example, the operation $Y=|A-B|$ (see FIG. 2)

is expanded as shown below.

if $A>B$ then $Y=A-B$ else $Y=B-A$

Figure 3:
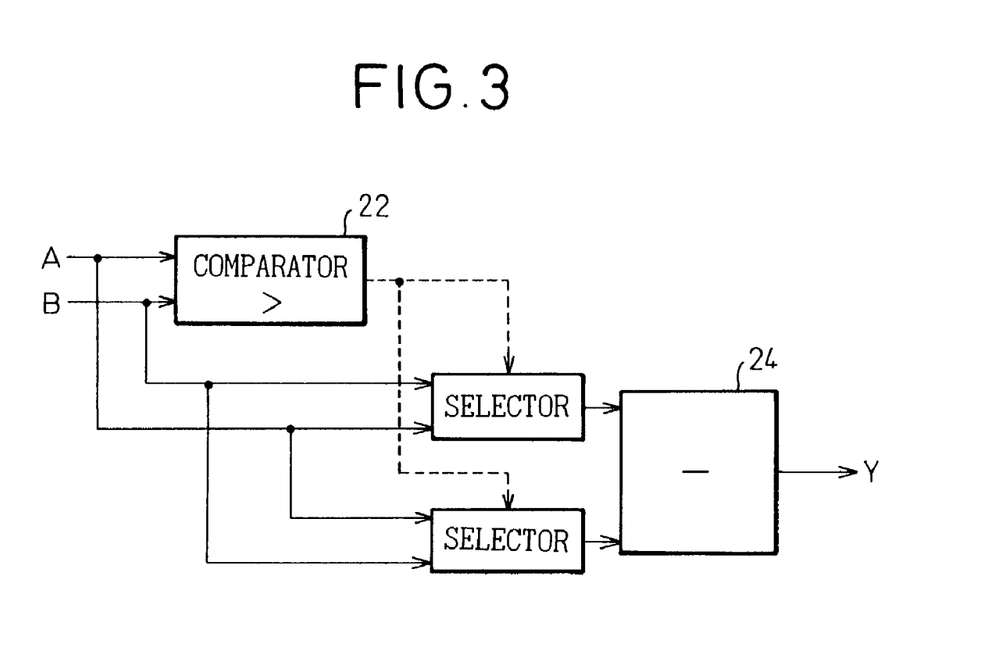
FIG. 3 is a diagram showing the operation of FIG. 2 in an expanded form.

This corresponds to the circuit shown in FIG. 3. After the operation has been expanded, DFT 16 is accomplished by referring to the prior art DFT library 17, and thus circuits for implementing the pass-through function are added to each of a comparator 22 and a subtractor 24 in FIG. 3.

Figure 4:
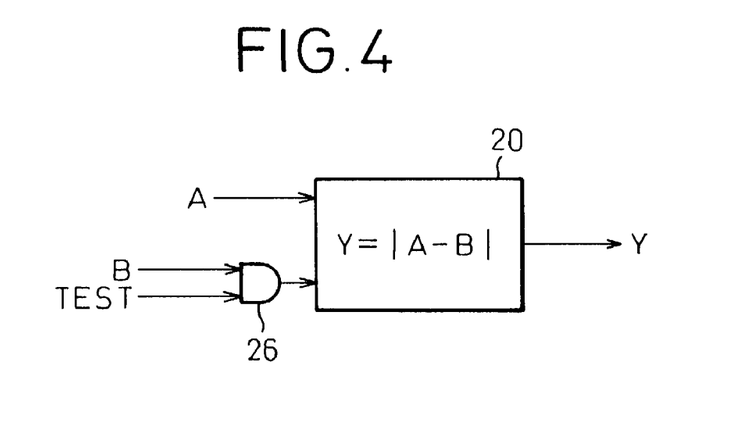
FIG. 4 is a diagram showing one example of a DFT implemented by considering the operation before expansion.

On the other hand, if attention is paid to the operation of FIG. 2 before expansion, the pass-through function for the operation $Y=|A-B|$ can be achieved as shown in FIG. 4 by just adding an AND circuit 26 whose B input is set zero when its TEST input is set to 0, and the area of the circuit to be added to implement the DFT can thus be reduced.

In the present invention, for each operation contained in the behavioral description, a decision is made as to whether the DFT is applied to the operation before expansion or to each of the circuit elements into which the operation has been expanded and, based on the decision thus made, an RTL description with DFT is generated from the behavioral description. This decision is made, for example, by evaluating the increase in circuit area that would result from adding the DFT method.

Figure 5:
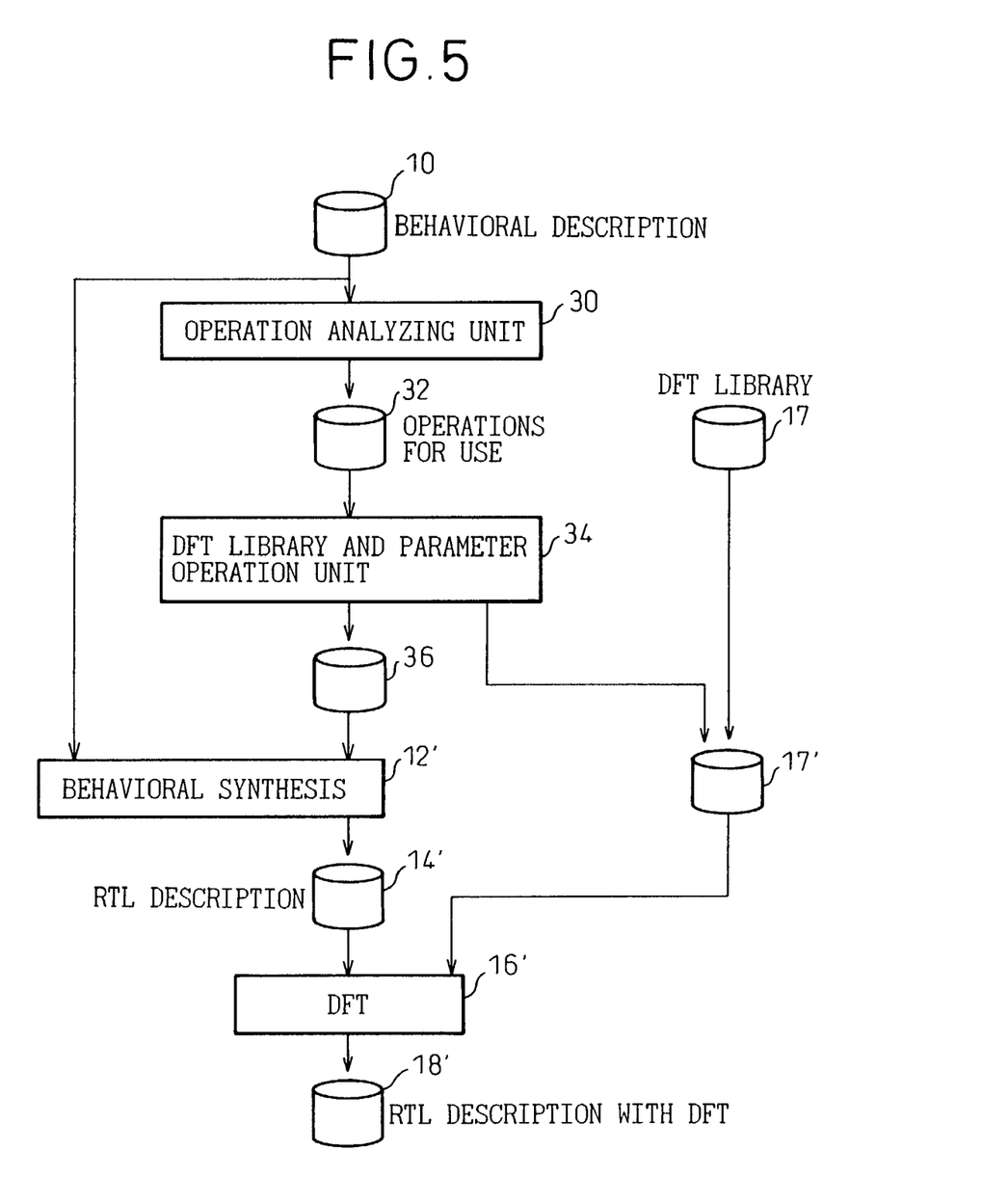
FIG. 5 is a diagram showing a DFT process according to the present invention.
Figure 6:
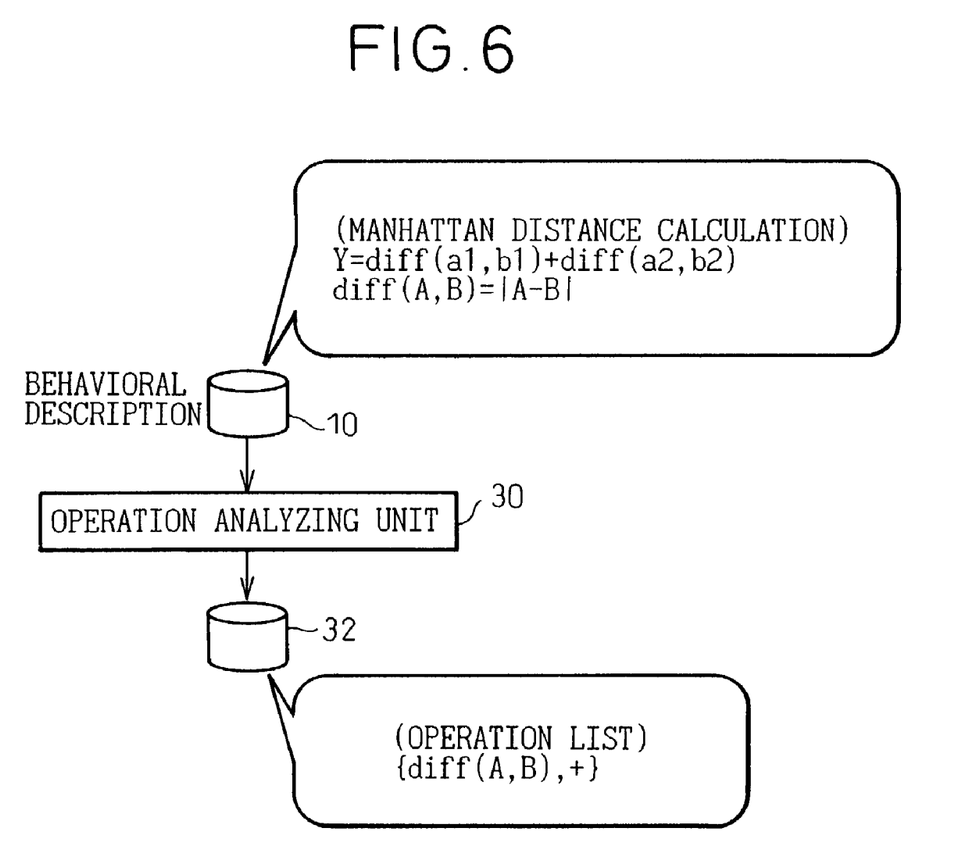
FIG. 6 is a diagram showing one example of the operation of an operation analyzing unit.
Figure 7:
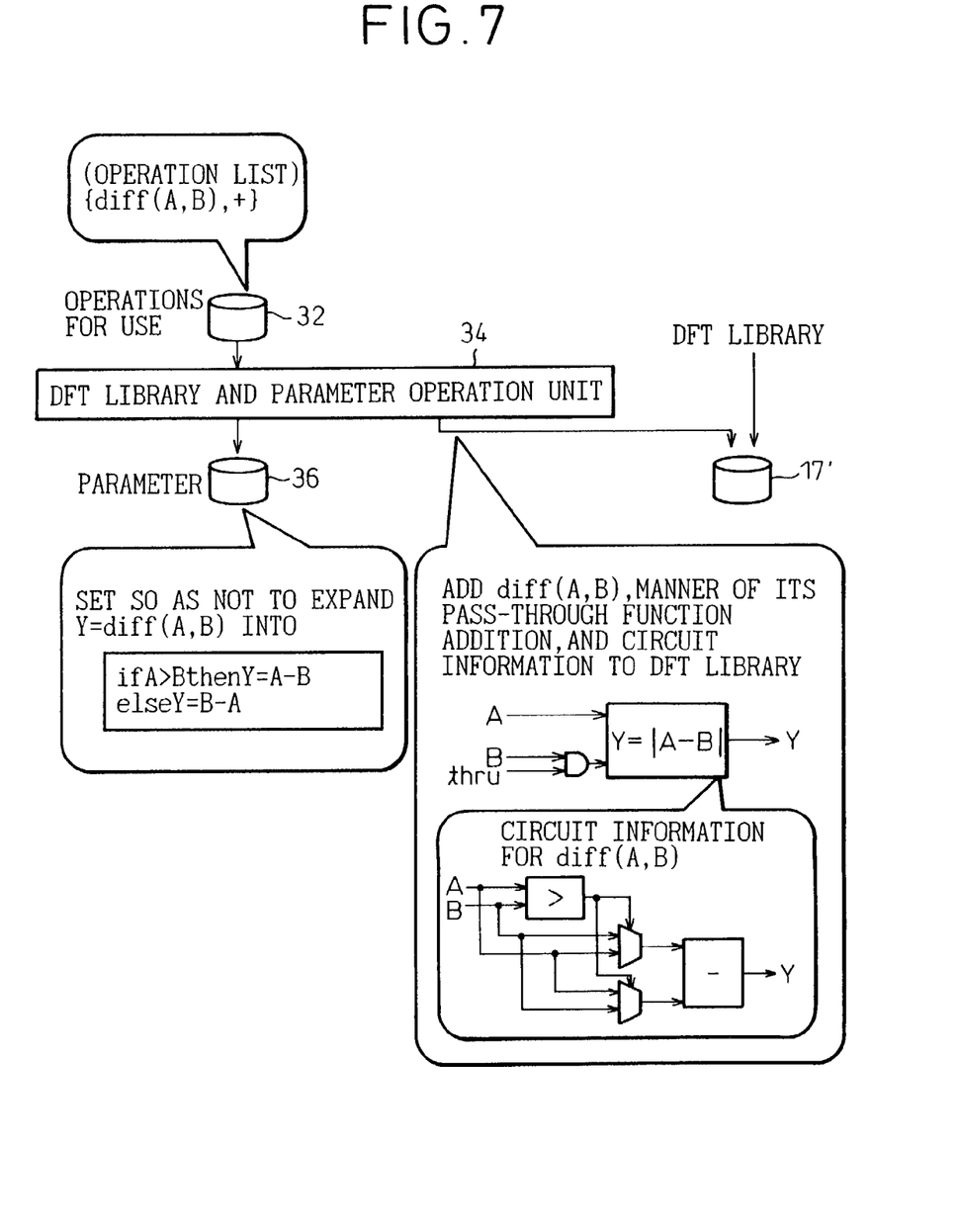
FIG. 7 is a diagram showing one example of the operation of a DFT library and parameter generating unit.

FIG. 5 is a flowchart illustrating one embodiment of a DFT process according to the present invention, FIG. 6 shows one example of the processing performed by an operation analyzing unit 30 contained therein, and FIG. 7 shows one example of the processing performed by a DFT library and parameter operation unit 34.

In FIG. 5, the operation analyzing unit 30 analyzes the kind of each operation appearing in the behavioral description 10 and extracts the operation. For example, in the case of a circuit for calculating the Manhattan distance between two points (a1, a2) and (b1, b2) as shown in FIG. 6, two operations, "diff(A, B)" and "+", are extracted as a for-use operation list 32 from the behavioral description 10.

The DFT library and parameter generating unit 34 takes the for-use operation list 32 as an input and, for each operation, makes a decision as to whether the operation is expandable or not; if it is expandable, the area of the circuit to be added, for example, is evaluated for the case where the DFT is applied to the operation before expansion and for the case where the DFT is applied after the expansion and, based on the result of the evaluation, a decision is made as to whether the DFT is to be applied to the operation before expansion or after the expansion. For any operation for which it is determined that the DFT is to be applied before expansion, a parameter 36 indicating that the operation is not to be expanded and information to be added to the DFT library 17 is generated and output. The information to be added to the DFT library includes the operation itself, how the DFT is implemented for the operation, and how the expansion is performed for the operation.

In the example of the circuit for calculating the Manhattan distance, a parameter indicating that Y=diff(A, B) is not to be expanded is generated, and the operation diff(A, B), how its pass-through function is added, and circuit information for expansion are generated as the information to be added to the DFT library 17, as shown in FIG. 7.

Turning back to FIG. 5, a behavioral synthesis unit 12' generates an RTL description 14' from the behavioral description 10. At this time, any operation specified by the parameter 36 not to be expanded is not expanded. A DFT unit 16' applies the DFT to the RTL description 14' by referring to the DFT library 17'. At this time, in the case of an operation whose circuit information for expansion is stored in the DFT library 17', the operation is expanded after adding the circuit generated for realizing DFT, and thus an RTL description with DFT 18' is generated. In the example of the circuit for calculating the Manhattan distance, an AND circuit (the same one as described earlier) is added to the B input in Y=|A−B| to implement the DFT, and the RTL description with DFT is generated in the form expanded into a comparator, selectors, and a subtractor.

Figure 8:
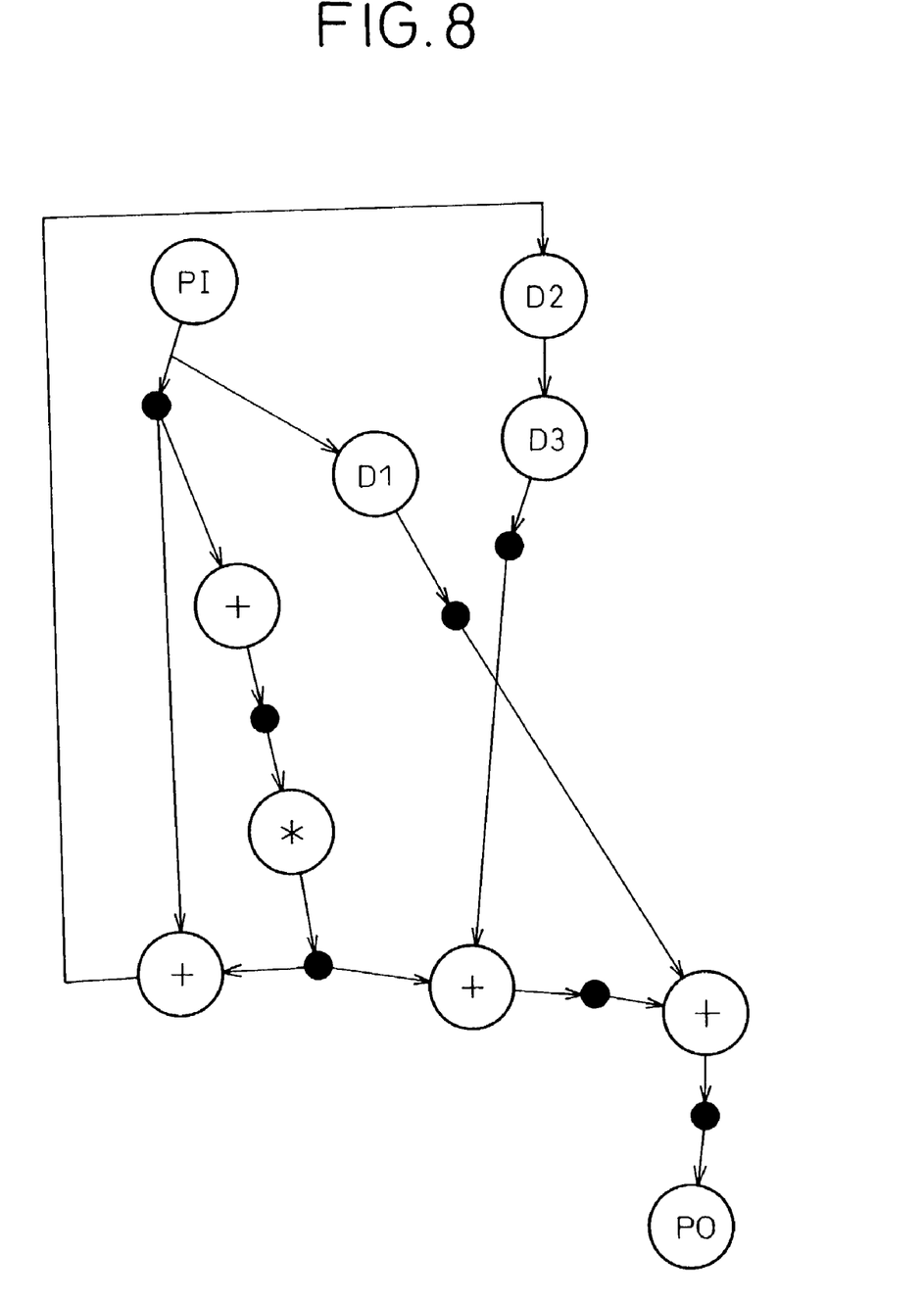
FIG. 8 is a data flow graph showing another example of the behavioral description.

FIG. 8 shows a data flow graph corresponding to a behavioral description of a third-order lattice wave filter. In the figure, PI is a data input, PO is a data output, D1, D2, and D3 are data conversions, and solid black circles are variables. In this case, the operation list that the operation analyzing unit 30 extracts is $$\{+(\text{addition}), *(\text{multiplication})\}$$

Figure 9:
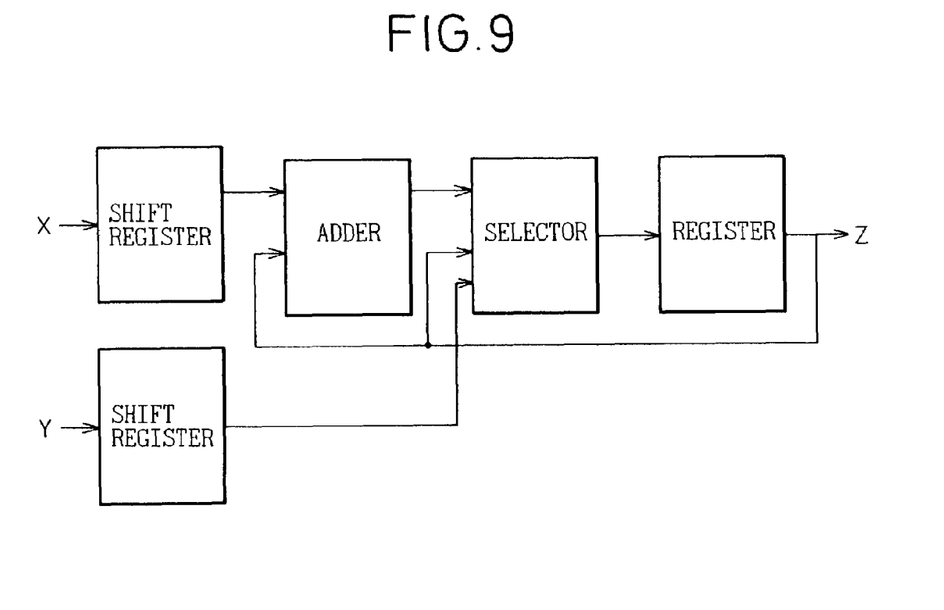
FIG. 9 is a diagram showing a multiplier in an expanded form.
Figure 10:
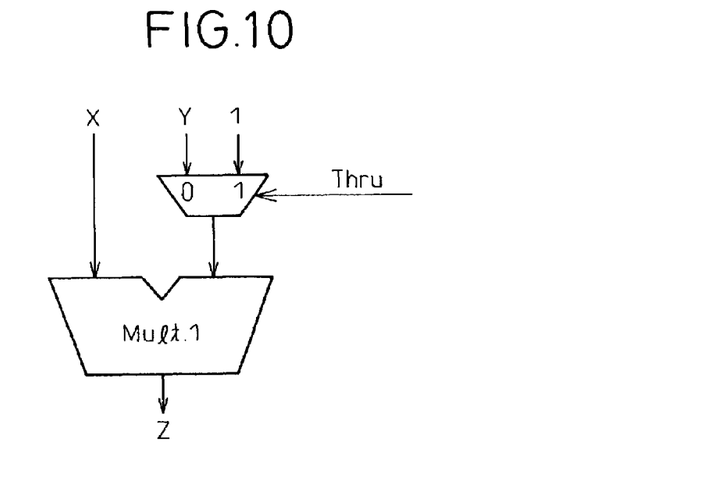
FIG. 10 is a diagram showing one example of DFT implemented by considering the multiplier before expansion.

In behavioral synthesis, a multiplier is usually expanded into a circuit shown in FIG. 9 that uses an adder, but if a DFT is applied to each circuit element of the expanded circuit, the area of the circuit to be added will increase. Therefore, the DFT library and parameter operation unit 34 adds to the DFT library the expanded configuration shown in FIG. 9 and the configuration shown in FIG. 10 for the multiplier, and generates a parameter indicating that * (multiplication) is not to be expanded into the circuit that uses an adder.

Figure 11:
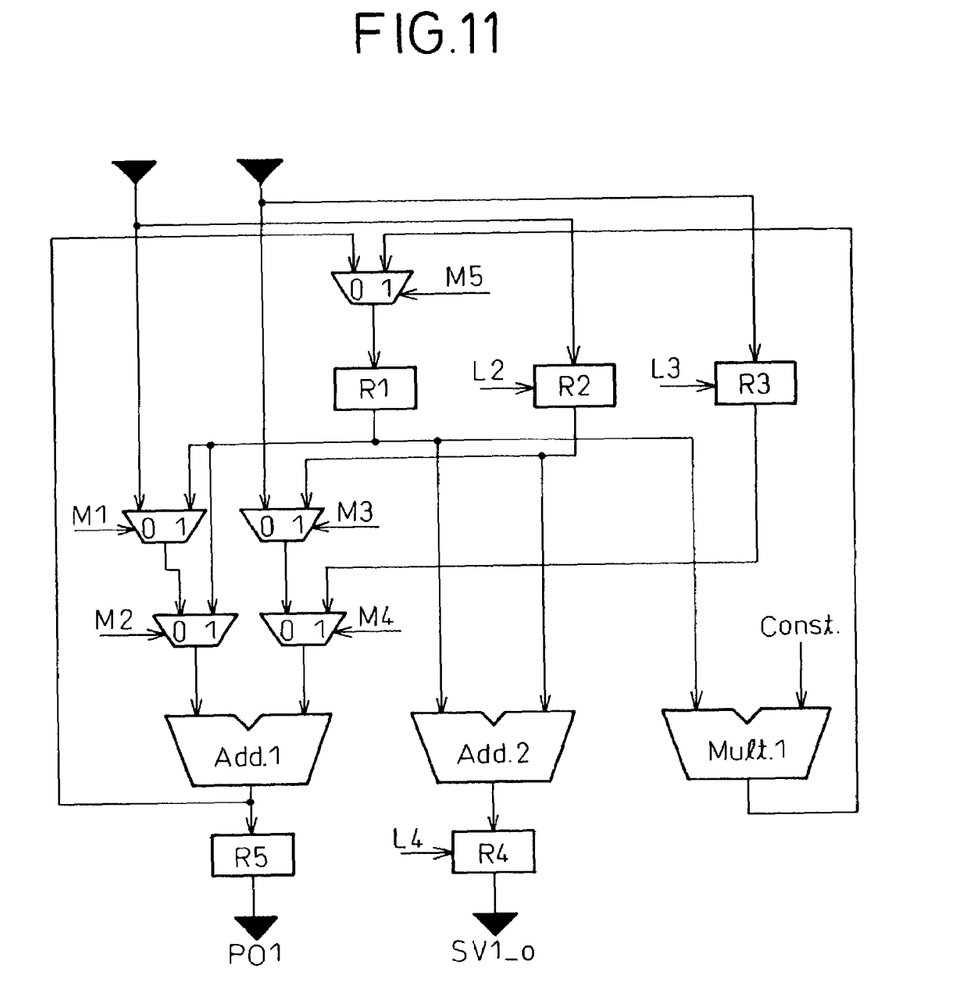
FIG. 11 is a diagram showing an RTL description generated from the behavioral description of FIG. 8.
Figure 12:
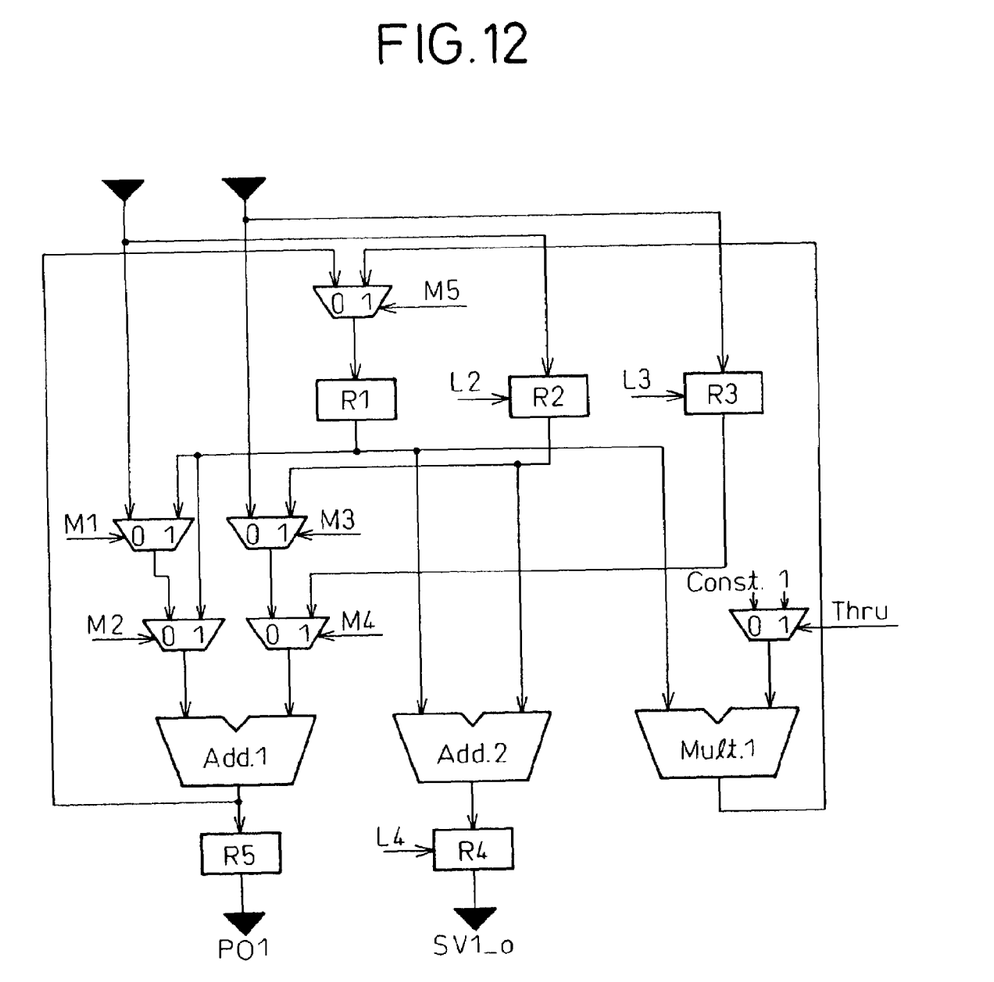
FIG. 12 is a diagram showing an RTL description with DFT.

As a result, the behavioral synthesis unit 12' generates the RTL description 14' without expanding the multiplier (Mult. 1), as shown in FIG. 11, and the DFT unit 16' applies DFT to the multiplier, as shown in FIG. 12, by referring to the DFT library 17'. Though not shown here, the DFT unit 16' thereafter expands the multiplier Mult. 1 into the configuration that uses an adder, based on the information stored in the DFT library 17'.

In the above example, the behavioral synthesis, the operation analyzing unit, and the DFT library and parameter generating unit have been described as being constructed as separate parts, but the configuration of the invention can also be implemented by incorporating the functions of the operation analyzing unit and the DFT library and parameter generating unit into the behavioral synthesis.

Figure 13:
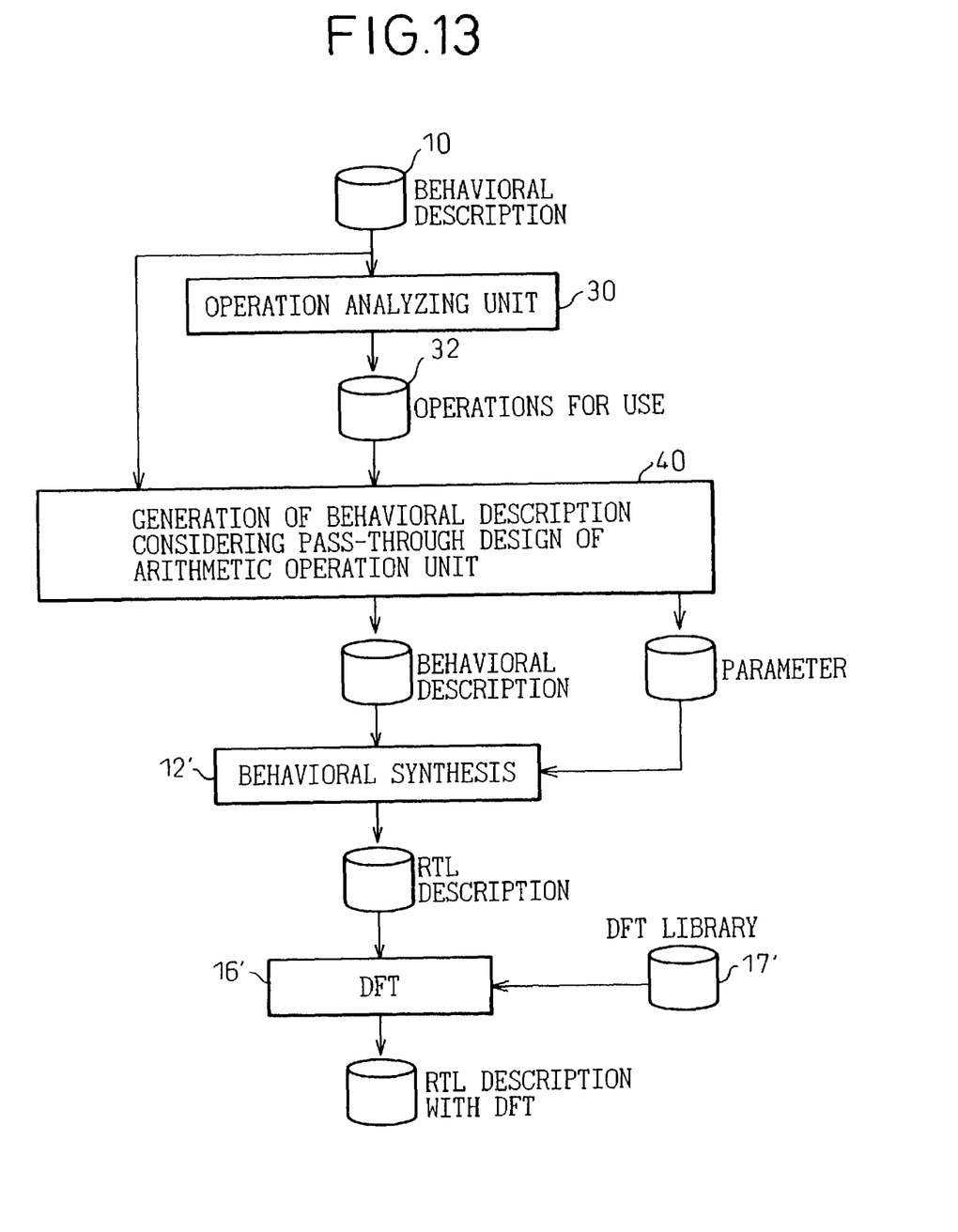
FIG. 13 is a diagram showing another example of the DFT process of the present invention.

Furthermore, the configuration can also be implemented by changing the behavioral description itself as shown in FIG. 13. In this case, in the example of the Manhattan distance calculation described above, the behavioral description (Manhattan distance calculation)

$$Y=\text{diff}(a1, b1)+\text{diff}(a2, b2) \quad \text{diff}(A, B)=|A-B|$$

is converted in a block 40 into (Manhattan distance calculation)

$$Y=\text{diff}(a1, b1)+\text{diff}(a2, b2) \quad \text{diff}(A, B)=|A-B|$$

(Algorithm for diff(A, B)) if A>B then diff$(A, B)=A-B$ else diff$(A, B)=B-A$ and a parameter indicating that diff(A, B) is not to be expanded is generated. The behavioral synthesis unit 12' generates the RTL description without expanding diff(A, B), as directed by the parameter, and the DFT unit 16' expands the operation after applying DFT to diff(A, B) by referring to the DFT library 17'.

The DFT method described so far is implemented using a program for causing a computer to execute prescribed processing. The program may be stored on a hard disk connected to the computer, or may be stored on a storage medium such as a CD-ROM and may be read as needed into an internal storage device within the computer by inserting the CD-ROM in a CD-ROM drive; alternatively, the program may be stored in a storage device connected to a network and may be read as needed into an internal storage device within the computer via the network. The method and apparatus of the invention are thus achieved.

As described above, according to the present invention, there is offered the advantageous effect of being able to reduce the area of the circuit to be added for easy testability.

The invention claimed is:

1. A method for testing a circuit design, the method comprising:
    (a) extracting one or more operations that are defined via data providing a behavioral description of a circuit to be tested;
    (b) comparing a first circuit area used for implementing a first testing technique and a second circuit area used for implementing a second testing technique, wherein the first testing technique is used for testing one of the extracted operations before generating an expanded description of the extracted operation, and the second testing technique is used for testing one or more of the individual circuit elements associated with the expanded description of the extracted operation;
    (c) selecting the first testing technique and adding a description for the first testing technique to a description of the circuit to be tested before expanding the extracted operation into the expanded description, if the first circuit area is smaller than the second circuit area;

(d) selecting the second testing technique and adding a description for the second testing technique to a description of the circuit to be tested after expanding the extracted operation into the expanded description, if the second circuit area is smaller than the first circuit area; and (e) generating data representing an RTL (register transfer level) description of the circuit incorporating the selected testing technique from the behavioral description, wherein the extracted operation is expanded into the expanded description of the operation when generating the data.

2. A method according to claim 1, wherein the step (c) includes the substeps of:
(i) generating for each extracted operation a parameter indicating whether or not the operation is to be expanded into the expanded description of the extracted operation; and
(ii) generating information indicating how the selected testing technique is implemented and circuit information of the individual circuit elements associated with the expanded description of the extracted operation in response to selection of the first testing technique, and
the step (e) includes the substeps of:
(i) generating the RTL description from the behavioral description in accordance with the parameter, the RTL description including a first RTL description generated by expanding the operation into the expanded description and a second RTL description generated without expanding the operation; and
(ii) generating the RTL description incorporating the selected testing technique from the first and the second RTL description in accordance with the information of the selected testing technique and the circuit information.

3. A method according to claim 2, wherein the information of the selected testing technique and the circuit information are added to a library which stores the information of the selected testing technique for each circuit element, and
in the substep (e)(ii), the RTL description incorporating the selected testing technique is generated from the first and the second RTL description by referring to the library.

4. A method according to claim 1, wherein the first and second circuit areas are determined based on a number of circuit elements to be added to the circuit.

5. An apparatus for testing a circuit design, the apparatus comprising:
an operation analyzing unit for extracting one or more operations that are defined via data providing a behavioral description of a circuit to be tested;
means for comparing a first circuit area used for implementing a first testing technique and a second circuit area used for implementing a second testing technique, wherein the first testing technique is used for testing one of the extracted operations before generating an expanded description of the extracted operation, and the second testing technique is used for testing one or more of the individual circuit elements associated with the expanded description of the extracted operation;
means for selecting the first testing technique and for adding a description for the first testing technique to a description of the circuit to be tested before expanding the extracted operation into the expanded description, if the first circuit area is smaller than the second circuit area;
means for selecting the second testing technique and for adding a description for the second testing technique to a description of the circuit to be tested after expanding the extracted operation into the expanded description, if the second circuit area is smaller than the first circuit area; and
means for generating data representing an RTL (register transfer level) description of the circuit incorporating the selected testing technique from the behavioral description, wherein the means for generating expands the extracted operation into the expanded description of the operation when generating the data.

6. An apparatus according to claim 5, wherein the means for selecting the first testing technique includes:
means for generating for each extracted operation a parameter indicating whether or not the operation is to be expanded into the expanded description of the extracted operation; and
means for generating information indicating how the selected testing technique is implemented and circuit information of the individual circuit elements associated with the expanded description of the extracted operation in response to selection of the first testing technique, and
the generating means includes:
a behavioral synthesis unit for generating the RTL description from the behavioral description in accordance with the parameter, the RTL description including a first RTL description generated by expanding the operation into the expanded description and a second RTL description generated without expanding the operation; and
a unit for generating the RTL description incorporating the selected testing technique from the first and the second RTL description in accordance with the information of the selected testing technique and the circuit information.

7. An apparatus according to claim 6, wherein the information of the selected testing technique and the circuit information are added to a library which stores the information of the selected testing technique for each circuit element, and
the unit for generating the RTL description generates the RTL description incorporating the selected testing technique from the first and the second RTL description by referring to the library.

8. An apparatus according to claim 5, wherein the first and second circuit areas are determined based on a number of circuit elements to be added to the circuit.

9. A program storage device readable by a machine, tangibly embodying a program of instructions executable by the machine for testing a circuit design, said program of instructions comprising:
(a) extracting one or more operations contained in a behavioral description of a circuit to be tested;
(b) comparing a first circuit area used for implementing a first testing technique and a second circuit area used for implementing a second testing technique, wherein the first testing technique is used for testing one of the extracted operations before generating an expanded description of the extracted operation, and the second testing technique is used for testing one or more of the individual circuit elements associated with the expanded description of the extracted operation;
(c) selecting the first testing technique and adding a description for the first testing technique to a description of the circuit to be tested before expanding the extracted operation into the expanded description, if the first circuit area is smaller than the second circuit area;
(d) selecting the second testing technique and adding a description for the second testing technique to a description of the circuit to be tested after expanding the extracted operation into the expanded description, if the second circuit area is smaller than the first circuit area; and (e) generating an RTL (register transfer level) description of the circuit incorporating the selected testing technique from the behavioral description, wherein the extracted operation is expanded into the expanded description of the operation when generating the data.

10. A program storage device according to claim 9, wherein the step (c) includes the substeps of:

(i) generating for each extracted operation a parameter indicating whether or not the operation is to be expanded into the expanded description of the extracted operation; and (ii) generating information indicating how the selected testing technique is implemented and circuit information of the individual circuit elements associated with the expanded description of the extracted operation in response to selection of the first testing technique, and the step (e) includes the substeps of:

(i) generating the RTL description from the behavioral description in accordance with the parameter, the RTL description including a first RTL description generated by expanding the operation into the expanded description and a second RTL description generated without expanding the operation; and (ii) generating the RTL description incorporating the selected testing technique from the first and the second RTL description in accordance with the information of the selected testing technique and the circuit information.

11. A program storage device according to claim 10, wherein the information of the selected testing technique and the circuit information are added to a library which stores the information of the selected testing technique for each circuit element, and in the substep (e)(ii), the RTL description incorporating the selected testing technique is generated from the first and the second RTL description by referring to the library.

12. A program storage device according to claim 9, wherein the first and second circuit areas are determined based on a number of circuit elements to be added to the circuit.

* * * * *